United States Patent [19]

Niemann et al.

[11] Patent Number: 5,490,325
[45] Date of Patent: Feb. 13, 1996

[54] GUARDED PRINTED CIRCUIT BOARD ISLANDS

[75] Inventors: James A. Niemann, Monroe Falls; George Topala, Lakewood, both of Ohio

[73] Assignee: Keithley Instruments, Cleveland, Ohio

[21] Appl. No.: 315,607

[22] Filed: Sep. 30, 1994

[51] Int. Cl.[6] .................................................. H05K 3/02
[52] U.S. Cl. .............................. 29/846; 29/829; 29/852; 174/262; 333/116; 333/238; 427/96; 427/97; 428/901
[58] Field of Search ........................... 29/830, 846, 829, 29/852; 428/901; 427/96, 97; 174/262; 333/238, 116

[56] References Cited

U.S. PATENT DOCUMENTS

| | | | |
|---|---|---|---|
| 4,426,773 | 1/1984 | Hargis | 437/8 X |
| 4,638,116 | 1/1987 | Gumb | 427/96 X |
| 4,644,302 | 2/1987 | Harris et al. | 333/238 X |
| 4,821,007 | 4/1989 | Fields et al. | 29/852 X |
| 4,883,920 | 11/1989 | Tanabe et al. | 228/180.21 X |
| 4,930,215 | 6/1990 | Roche et al. | 333/238 X |
| 5,274,915 | 1/1994 | Matsushima et al. | 29/846 |
| 5,276,963 | 1/1994 | Flanders | 174/262 X |

*Primary Examiner*—Carl J. Arbes
*Attorney, Agent, or Firm*—Pearne, Gordon, McCoy & Granger

[57] ABSTRACT

Low dielectric absorption component connection points are created on a printed circuit board by cutting apertures in the board surrounding the points, leaving only narrow stems still connecting the resulting island to the board.

3 Claims, 1 Drawing Sheet

GUARDED PRINTED CIRCUIT BOARD ISLANDS

BACKGROUND OF THE INVENTION

The present invention relates to precision electrical measurement devices and in particular to a method for providing component connection points having very low dielectric absorption in such devices.

In devices for measuring very low currents (e.g., nanoamperes and below), conventional printed circuit board designs absorb unacceptable numbers of electrons or other charge carriers at the low current nodes of the devices. This absorption is referred to as dielectric absorption.

In order to overcome this limitation, holes are drilled in the board and standoffs are inserted. The standoffs are made of materials such as sapphire or Teflon plastic that have the desired low dielectric absorption. As shown in FIG. 1, the standoff 1 is typically provided with a soldering post 2. Leads 3, 4 from the components to be connected are soldered to the post 2. The standoff 1 prevents unacceptable levels of charge or current from moving between the post 2 and the printed circuit board 5.

In addition to the expense of the standoffs themselves, this technique has the serious disadvantage that the connections have to be hand soldered and cleaned. This creates substantial cost increases over flow soldering. Also, the use of standoffs interferes with ability to shrink overall device size as components are miniaturized and/or integrated.

SUMMARY OF THE INVENTION

The present invention provides an improved method for providing component connection areas having low dielectric absorption that allows components to be automatically inserted and soldered without the expensive hand work of the prior art.

In addition, the method results in a decrease in error currents resulting from flexing and vibration of the device.

The invention includes method for providing on a printed circuit board a component connection area of the board having low dielectric absorption. It includes the steps of creating at least one component electrical connection point within the connection area and creating one or more apertures in the board. The one or more apertures completely surround the connection area except for one or more narrow stems between the connection area and the board. The stems have an aggregate width substantially smaller than the perimeter of the connection area.

DESCRIPTION OF THE PREFERRED EMBODIMENT

Figure 1:
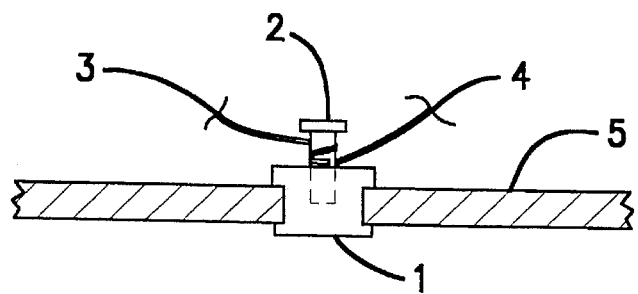
FIG. 1 is a cross sectional elevation view of a prior art printed circuit board using a standoff for a low current node.
Figure 2:
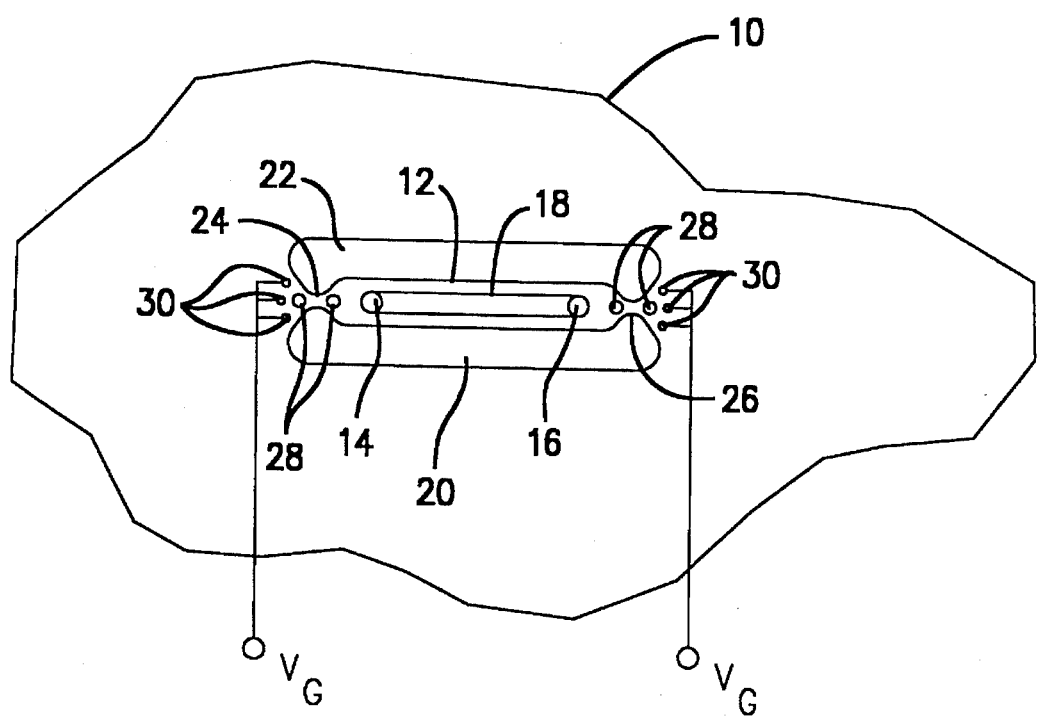
FIG. 2 is a partial plan view of a printed circuit board using the method of the invention to provide a low dielectric absorption low current node.

Referring to FIG. 2, a printed circuit board 10 contains a component connection area 12. The component connection area 12 is provided with, for example, two component connection holes 14, 16. The holes 14, 16 are connected by a circuit board trace 18. The holes 14, 16 and the trace 18 provide an electrical connection point for at least two components. Typically component leads would be inserted in the holes 14, 16 and soldered. The connection area 12 could also be, for example, equivalently provided with interconnected solder pads for component connection.

Apertures 20, 22 are located about the connection area 12. The apertures 20, 22 serve to isolate the connection area 12 from the rest of the board 10, except for the narrow stems 24, 26. While it is possible to eliminate, for example, stem 26, the resulting structure would often lack satisfactory mechanical strength.

The apertures 20, 22 may be created in the board 10 by such methods as, for example, drilling, sawing, cutting, routing, vaporization, molding, machining or etching.

Additional stems (which correspond to more apertures) can be used to increase mechanical strength. However, to obtain the advantages of the invention, the aggregate width of the stems should be substantially less than the perimeter of the connection area 12. For example, the aggregate width may be one fifth or less of the perimeter.

To further isolate the connection area 12, the stems 24, 26 may be provided with small apertures 28. The apertures 28 serve to further lower the cross section of the stems 24, 26 available for charge flow. The apertures 28 can be multiplied to an extent commensurate with the desired mechanical strength of the stems 24, 26.

Further isolation of the connection area 12 can be achieved by providing guard apertures 30 at the approach to the stems 24, 26. In the preferred embodiment, the apertures 30 are plated through with the circuit board trace material to maximize the cross sectional area available to collect charges. The apertures 30 are connected to a guard voltage $V_G$ the provides a sink for charges collected by the walls of the apertures 30. In some cases, it may be desirable to place the apertures 30 at the connection area 12 approach to the stems 24, 26.

The connection area 12 provides dielectric absorption performance as good or better as the prior art standoffs without the cost of standoffs. But even more advantageously, the connection area 12 allows components to be inserted in the board 10 with automatic component insertion machines and then flow soldered. This eliminate the expensive hand work that was previously required.

In addition, an unexpected improvement has been identified. Precision measurement devices suffer to some extent from "microphonic" effects. Flexing and vibration of the boards and/or components sometimes literally squeeze charges out of the materials of the device resulting in measurable currents. The present invention decreases these microphonic effects. It is now suspected that this decrease occurs because the apertures lower the mechanical coupling between the components.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A method for providing on a printed circuit board a component connection area of said board having low dielectric absorption, comprising:

creating at least one component electrical connection point within said connection area; and creating one or more apertures in said board, said one or more apertures completely surrounding said connection area except for one or more narrow stems between said connection area and said board, said stems having an aggregate width substantially smaller than the perimeter of said connection area.

2. A method according to claim 1, further comprising providing at least one additional aperture in at least one of said stems.

3. A method according to claim 1, further comprising:

providing at least one guard aperture in said board at an approach to at least one of said stems, lining said guard aperture with an electrical conductor, and providing for connection of said electrical conductor to an electrical charge sink.

* * * * *